United States Patent
Wu

(10) Patent No.: US 11,168,288 B2
(45) Date of Patent: Nov. 9, 2021

(54) PHOTORESIST REMOVER COMPOSITIONS

(71) Applicant: Merck Patent GmbH, Darmstadt (DE)

(72) Inventor: Hengpeng Wu, Hillsborough, NJ (US)

(73) Assignee: Merck Patent GmbH, Darmstadt (DE)

( * ) Notice: Subject to any disclaimer, the term of this patent is extended or adjusted under 35 U.S.C. 154(b) by 0 days.

(21) Appl. No.: 16/962,456

(22) PCT Filed: Oct. 31, 2018

(86) PCT No.: PCT/EP2018/079848
§ 371 (c)(1),
(2) Date: Jul. 15, 2020

(87) PCT Pub. No.: WO2019/158234
PCT Pub. Date: Aug. 22, 2019

(65) Prior Publication Data
US 2021/0071120 A1    Mar. 11, 2021

Related U.S. Application Data

(60) Provisional application No. 62/630,470, filed on Feb. 14, 2018.

(51) Int. Cl.
| | |
|---|---|
| *C11D 7/50* | (2006.01) |
| *C11D 7/26* | (2006.01) |
| *C11D 7/32* | (2006.01) |
| *C11D 11/00* | (2006.01) |
| *G03F 7/42* | (2006.01) |

(52) U.S. Cl.
CPC ............ *C11D 7/261* (2013.01); *C11D 7/3209* (2013.01); *C11D 11/0047* (2013.01); *G03F 7/425* (2013.01)

(58) Field of Classification Search
CPC .................................................. C11D 11/0047
USPC ......................................................... 510/175
See application file for complete search history.

(56) References Cited

U.S. PATENT DOCUMENTS

| | | | |
|---|---|---|---|
| 7,601,482 B2 | 10/2009 | Pawlowski et al. | |
| 2002/0111283 A1* | 8/2002 | Argentieri | ................ C11D 7/30 510/167 |
| 2003/0181344 A1 | 9/2003 | Ikemoto et al. | |
| 2016/0254164 A1 | 9/2016 | Sugishima et al. | |
| 2019/0071623 A1* | 3/2019 | Kamimura | ............... C11D 7/02 |
| 2019/0317409 A1* | 10/2019 | Peters | .................. C11D 7/5022 |

FOREIGN PATENT DOCUMENTS

| | | |
|---|---|---|
| WO | 99/16855 A1 | 4/1999 |
| WO | 2009/155782 A1 | 12/2009 |
| WO | 2017/194449 A1 | 11/2017 |
| WO | 2019/158234 A1 | 8/2019 |

OTHER PUBLICATIONS

Dammel Ralph R., Diazonapththoquinone-based Resists, Chapter 2, Basic Chemistry of DNQ/Novolak Resists, SPIE Optional Engineering Press volume TT, vol. 11, 1993, 9 pages.
International Preliminary Report on Patentability received for PCT Patent Application No. PCT/EP2018/079848, dated Aug. 27, 2020, 8 pages.
International Search Report and Written Opinion received for PCT Patent Application No. PCT/EP2018/079848 dated Feb. 22, 2019, 12 pages.

* cited by examiner

*Primary Examiner* — Gregory E Webb
(74) *Attorney, Agent, or Firm* — Francis M. Houlihan

(57) ABSTRACT

The present invention relates to a remover composition comprising, tetraalkylammonium hydroxide, a benzylic alcohol, a glycol component comprising at least one glycol compound, and a and an alkyl amine component, wherein said alkyl amine component is selected from the group consisting of a dialkyl amine, a mono-alkyl amine having structure having structure (I), and combinations thereof wherein, in said di-alkyl amine, one of the alkyl groups is a C-1 to C-4 n-alkyl and the other alkyl group is a C-16 to C-20 n-alkyl, and for said mono-alkyl amine m' and m are independently chosen from an integer ranging from 4 to 8. This invention also pertains to the process of using these compositions to remove a patterned photoresist from a substrate.

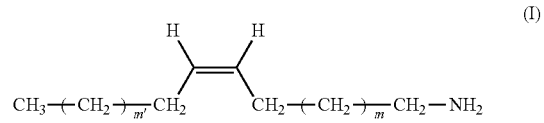

(I)

26 Claims, No Drawings

PHOTORESIST REMOVER COMPOSITIONS

This application is a United States National Stage Patent Application under 35 U.S.C. § 371 of International Patent Application No. PCT/EP2018/079848, filed Oct. 31, 2018 which claims priority to U.S. Provisional Patent Application No. 62/630,470, filed Feb. 14, 2018, the contents of each of which are being hereby incorporated herein by reference.

FIELD OF INVENTION

The present invention relates to a high $pK_a$ remover composition comprising tetraalkylammonium hydroxide, a benzylic alcohol, at least one glycol compound, and an alkyl amine component, wherein said alkyl amine component is selected from the group consisting of a di-alkyl amine, a mono-alkyl amine having structure having structure (I), and mixtures combinations thereof, wherein for said di-alkyl amine the alkyl groups is a C-1 to C-4 n-alkyl and the other is a C-16 to C-20 n-alkyl. These remover solutions show clean removal of photoresist patterns from substrates. Further, when the substrate is a metal such as copper, the removal of the patterned resist does not cause any corrosion of the metal substrate.

BACKGROUND

This invention relates to an inventive composition which may be used as a chemical stripper composition that removes cross-linked polymer coatings using novel remover compositions which do not promote corrosion of metal substrates.

Many commercialized strippers for microelectronic coatings do not perform sufficiently to meet minimum manufacturing requirements. The invention pertains to a novel composition for a high $pK_a$ removal products for use in the removal of lithographic resist patterns on a substrate which were produced by a base developable, negative, cross-linking photoresist systems.

During the manufacture of these microcircuits or microdevices, various inorganic substrates such as single and polycrystalline silicon, hybrid semiconductors such as gallium arsenide, and metals, are coated with an organic coating ("photoresist", or resist) which forms a resistant framework of permanent or temporary design and exhibits a pattern after undergoing a photolithographic process. The photoresist may be utilized to insulate conductors or protect selected areas of the substrate surface, such as silicon, silicon dioxide, or aluminum, from the action of chemicals in both wet (chemical) and dry (plasma) forms. In the case of the material being utilized as a photoresist, exposed areas of the substrate may carry out a desired etch subtraction (removal) or deposition (addition) process. Following completion of this operation and after subsequent rinsing or conditioning, it is necessary that the resist and any application post-etch residue be removed to permit essential finishing operations. Upon removal of the photoresist, specific micro-etched or deposited patterns are left behind. The masking and patterning processes are repeated several times to produce layered arrangements that comprise the art of the final device. Each step requires complete resist stripping, to ensure that the final form device is produced at relatively high yields and performs satisfactorily.

There is a need for novel strippers/removers which can remove negative photoresist pattern produced by a base developable, negative, cross-linking photoresist systems, by utilizing a safe chemistry, avoiding dimethyl sulfoxide (DMSO), which although relatively non-toxic is a material that is a known carrier of other potentially deleterious chemicals through the skin barrier. Consequently, removing DMSO from stripper/removers would reduce the potential of harm to workers. DMSO is also prone to decomposition near its boiling temperature, and this decomposition temperature may be substantially lowered, by the presence of basic catalysts. This is of concern for basic high $pK_a$ remover solution, if they are to be safely usable as a heated solution. Further, DMSO based strippers may have a objectional odor, due to the presence of sulfide impurities, and an odor free stripper would be beneficial for use in closed manufacturing area, where ventilation issues may arise. Further, to these goals is also the need of designing an alternate high $pK_a$ stripper/remover which avoids the use of DMSO, but also avoids the use of any alternative solvents with a low flash point, especially those whose boiling points are below about 150° C., or any alternate solvents which may have deleterious toxicology. Finally, such a novel remover, omitting DMSO, should be able to remove all the patterned resist from substrates, without leaving any residue, especially on metallic substrates such as copper.

SUMMARY OF THE INVENTION

In one of its aspects, the present invention relates to a composition comprising, a tetraalkylammonium hydroxide, a benzylic alcohol, at least one glycol compound, and an alkyl amine component, wherein said alkyl amine component is selected from the group consisting of
- a di-alkyl amine, in which one of the alkyl groups is a C-1 to C-4 n-alkyl and the other is a C-16 to C-20 n-alkyl,
- a mono-alkyl amine having structure having structure (I), wherein m' and m are independently chosen from an integer ranging from 4 to 8;
- and combinations thereof.

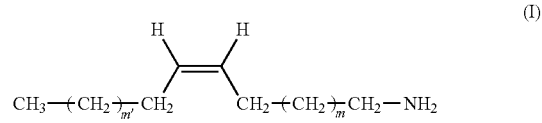

Further, this invention also pertains to the process of using the above compositions to remove a patterned photoresist from a substrate.

DETAILED DESCRIPTION

It is to be understood that both the foregoing general description and the following detailed description are illustrative and explanatory, and are not restrictive of the subject matter, as claimed. In this application, the use of the singular includes the plural, the word "a" or "an" means "at least one", and the use of "or" means "and/or", unless specifically stated otherwise. Furthermore, the use of the term "including", as well as other forms such as "includes" and "included", is not limiting. Also, terms such as "element" or "component" encompass both elements and components comprising one unit and elements or components that comprise more than one unit, unless specifically stated otherwise. As used herein, the conjunction "and" is intended to be inclusive and the conjunction "or" is not intended to be exclusive unless otherwise indicated. For example, the phrase "or, alternatively" is intended to be exclusive. As used herein, the term "and/or" refers to any combination of the foregoing elements including using a single element.

The term (meth)acrylate is a term which embodies in one term both acrylate and methacrylate.

Herein, unless otherwise indicated, alkyl refers to hydrocarbon groups which can be linear, branched (e.g. methyl, ethyl, propyl, isopropyl, tert-butyl and the like) or cyclic (e.g. cyclohexyl, cyclopropyl, cyclopentyl and the like) multicyclic (e.g. norbornyl, adamanty and the like). These alkyl moieties may be substituted or unsubstituted as described below. The term alkyl refers to such moieties with C-1 to C-20 carbons. It is understood that for structural reasons linear alkyls start with C-1, while branched alkyls and linear start with C-3 and multicyclic alkyls start with C-5. Moreover, it is further understood that moieties derived from alkyls described below such as alkyloxy, haloalkyloxy have the same carbon number is present in the composition in an amount unless otherwise indicated. If the length of the alkyl group is specified as other than described above, the above described definition of alkyl still stands with respect to it encompassing all types of alkyl moieties as described above and that the structural consideration with regards to minimum number of carbon for a given type of alkyl group still apply.

Alkyloxy (a.k.a. Alkoxy) refers to an alkyl group as defined above on which is attached through an oxy (—O—) moiety (e.g. methoxy, ethoxy, propoxy, butoxy, 1,2-isopropoxy, cyclopentyloxy cyclohexyloxy and the like). These alkyloxy moieties may be substituted or unsubstituted as described below.

Halo or halide refers to a halogen, F, Cl, Br, I which is linked by one bond to an organic moiety.

Haloalkyl refers to a linear, cyclic or branched saturated alkyl group such as defined above in which at least one of the hydrogens has been replaced by a halide selected from the group consisting of F, Cl, Br, I or mixture of these if more than one halo moiety is present. Fluoroalkyls are a specific subgroup of these moieties.

Fluoroalkyl refers to a linear, cyclic or branched saturated alkyl group as defined above in which the hydrogens have been replaced by fluorine either partially or fully (e.g. trifluoromethyl, perfluoroethyl, 2,2,2-trifluoroethyl, perfluoroisopropyl, perfluorocyclohexyl and the like). These fluoroalkyl moieties, if not perfluorinated, may be substituted or unsubstituted as described below.

Fluoroalkyloxy refers to a fluoroalkyl group as defined above on which is attached through an oxy (—O—) moiety it may be completed fluorinated (a.k.a. perfluorinated) or alternatively partially fluorinated (e.g. trifluoromethyoxy, perfluoroethyloxy, 2,2,2-trifluoroethoxy, perfluorocyclohexyloxy and the like). These fluoroalkyl moieties, if not perfluorinated may, be substituted or unsubstituted as described below.

Herein when referring to an alkyl, alkyloxy, fluoroalkyl, fluoroalkyloxy moieties with a possible range of carbon atoms which starts with C-1 such as for instance "C-1 to C-20 alkyl," or "C-1 to C-20 fluoroalkyl," as non-limiting examples, this range encompasses linear alkyls, alkyloxy, fluoroalkyl and fluoroalkyloxy starting with C-1 but only designated branched alkyls, branched alkyloxy, cycloalkyl, cycloalkyloxy, branched fluoroalkyl, and cyclic fluoroalkyl starting with C-3.

Herein the term alkylene refers to hydrocarbon groups which can be a linear, branched or cyclic which has two or more attachment points (e.g. of two attachment points: methylene, ethylene, 1,2-isopropylene, a 1,4-cyclohexylene and the like; of three attachment points 1,1,1-substituted methane, 1,1,2-substituted ethane, 1,2,4-substituted cyclohexane and the like). Here again, when designating a possible range of carbons, such as C-1 to C-20, as a non-limiting example, this range encompasses linear alkylenes starting with C-1 but only designates branched alkylenes, or cycloalkylene starting with C-3. These alkylene moieties may be substituted or unsubstituted as described below.

Herein the term Aryl or aromatic groups refers to such groups which contain 6 to 24 carbon atoms including phenyl, tolyl, xylyl, naphthyl, anthracyl (and other fused aromatic ring hydrocarbons), biphenyls, bis-phenyls, tris-phenyls and the like. These aryl groups may further be substituted with any of the appropriate substituents e.g. alkyl, alkoxy, acyl or aryl groups mentioned hereinabove.

Unless otherwise indicated in the text, the term "substituted" when referring to an phenyl, benzyl, benzylic moiety, alkyl, alkyloxy, fluoroalkyl, fluoroalkyloxy, fused aromatic ring, arene, heteroarene refers to one of these moieties which also contain with one or more substituents, selected from the group consisting of unsubstituted alkyl, substituted alkyl, unsubstituted aryl, alkyloxyaryl (alkyl-O-aryl-), dialkyloxyaryl ((alkyl-O—)$_2$-aryl), haloaryl, alkyloxy, alkylaryl, haloalkyl, halide, hydroxyl, cyano, nitro, and acetyl.

The term benzylic refers to both an unsubstituted benzyl moiety (a.k.a. Ph-CH$_2$—) and substituted benzyl moieties, which be substituted at the Ph or at the α-position or a mixture of these two positions. As non-limiting examples the substituent at the phenyl position of the benzyl moiety may be selected from an C-1 to C-4 alkyl moiety, a C-1 to C-4 alkoxy, a C-1 to C-4 perfluoroalkyl, a halide (F—, Cl—, Br—), a —CN, or mixtures of these substituents, and further wherein as further non-limiting examples the substituents at the α-position of the benzyl moiety it may be selected from a C-1 to C-4 alkyl moiety, or a C-1 to C-4 perfluoro moiety.

Similarly, the term "unsubstituted" refers to these same moieties, wherein no substituents apart from hydrogen is present.

The term "stripper," and "remover," are synonymous.

The section headings used herein are for organizational purposes and are not to be construed as limiting the subject matter described. All documents, or portions of documents, cited in this application, including, but not limited to, patents, patent applications, articles, books, and treatises, are hereby expressly incorporated herein by reference in their entirety for any purpose. In the event that one or more of the incorporated literature and similar materials defines a term in a manner that contradicts the definition of that term in this application, this application controls.

The term tetraalkylammonium encompasses embodiments wherein the alkyl group is a linear, branched, or cyclic alkyl, it also encompasses substituted alkyls including one in which the substituent is a phenyl moiety (or a substituted phenyl moiety) forming together a benzylic moiety.

When referring to compositions in terms of wt % it is understood that in no event shall the wt % of all components, including non-essential components, such as impurities, add to more than 100 wt %. The composition of all essential components may add up to less than 100 wt % in those instances wherein the composition contains some small amount of a non-essential contaminants or impurities. Otherwise, if no significant non-essential impurity component is present, it is understood that the composition of all essential components will essentially add up to 100 wt %.

The present invention relates to an inventive composition comprising, tetraalkylammonium hydroxide, a benzylic alcohol, a glycol component comprising at least one glycol compound, and an alkyl amine component, wherein said alkyl amine component is selected from the group consisting of a di-alkyl amine, in which one of the alkyl groups is a C-1 to C-4 n-alkyl and the other is a C-16 to C-20 n-alkyl, a mono-alkyl amine having structure having structure (I), wherein m' and m are independently chosen from an integer ranging from 4 to 8, and combination thereof.

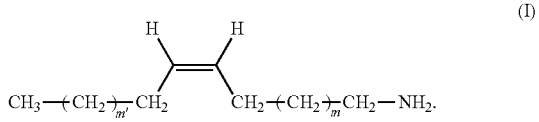

This composition is either a liquid at about room temperature, or is a composition which becomes liquid when heated to a temperature not exceeding 200° C. In another embodiment this is a composition which is either liquid at about room temperature or when heated to a temperature not exceeding 100° C. In yet another embodiment, it is a composition which is either liquid at room temperature or when heated at a temperature not exceeding 80° C. In still another embodiment it is a composition which is liquid at about room temperature.

In one embodiment of the novel composition said tetraalkylammonium hydroxide has structure (II), wherein $Ra_1$, $Ra_2$, $Ra_3$, and $Ra_4$ are independently selected from a C-1 to C-16 alkyl, or a benzylic moiety.

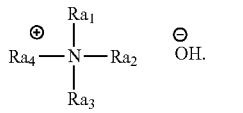

In another embodiment of the novel composition, said tetraalkylammonium hydroxide is selected from compounds having structure (II), wherein $Ra_1$, $Ra_2$, $Ra_3$, and $Ra_4$ are independently selected from a C-1 to C-4 linear alkyl, or a benzylic moiety.

In yet another embodiment of the novel composition, said tetraalkylammonium hydroxide is selected from the group consisting of tetramethylammonium hydroxide, tetraethylammonium hydroxide, tetrapropylammonium hydroxide, tetrabutylammonium hydroxide, and benzyltrimethylammonium hydroxide.

In still another embodiment of the novel composition, said tetraalkylammonium hydroxide is tetramethylammonium hydroxide.

In any of the embodiments of the inventive composition, described herein, the tetraalkylammonium hydroxide is present in the composition in an amount from about 0.5 wt % to about 10 wt % of said composition. In another aspect of this embodiment said tetramethylammonium hydroxide is present in the composition in an amount from about 2 wt % to about 8 wt % of said composition. In yet another embodiment it is present in the composition in an amount from about 3 wt % to about 7 wt %. In still another embodiment it is present in the composition in an amount from about 4 wt % to about 6 wt %. In one aspect of this embodiment said tetraalkylammonium hydroxide is tetramethylammonium hydroxide.

In some of the embodiments of the inventive composition, described herein, water may be present as an optional component is present in the composition in an amount from about 1 wt % to about 20 wt % of said composition. In another aspect of this embodiment said water is present in the composition in an amount from about 8 wt % to about 15 wt %.

In embodiments of the inventive composition, described herein wherein the composition is substantially water-free, this entail that there is no deliberately added water, for instance added as either free water, as a hydrate of a tetraalkylammonium hydroxide, or as part of water present in a known percentage in either the benzylic alcohol component or the glycol component. These substantially water free-embodiments may still contain water introduced as impurities present at less than about 0.9 wt % in the composition. In another aspect of this substantially water-free-embodiment it may contain less than about 0.5 wt %. In yet another aspect of the this substantially water free embodiment may contain less than about 0.1 wt %. In still other aspects of this embodiment it may contain less than about 0.01 wt % or less than 0.001 wt % and the like.

In one embodiment of the inventive composition, said benzylic alcohol has structure (III), wherein $Rb_1$ is selected from the group consisting of H, a C-1 to C-4 alkyl, and a C-1 to C-4 alkoxy, and $Rb_2$ is H or a C-1 to C-4 alkyl.

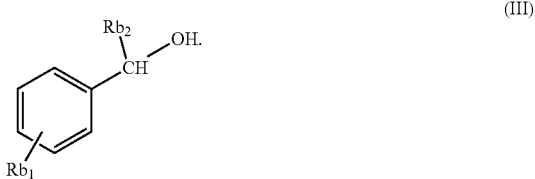

In another embodiment of the inventive composition, wherein said benzylic alcohol has structure (III), $Rb_1$ is H. In yet another embodiment of the inventive composition, wherein said benzylic alcohol has structure (III), $Rb_1$ is a C-1 to C-4 alkyl. In still another embodiment of the inventive composition, wherein said benzylic alcohol has structure (III), $Rb_1$ is a C-1 to C-4 alkoxyl. In yet another embodiment of the inventive composition wherein said benzylic alcohol has structure (III), $Rb_2$ is H. In another embodiment of the inventive composition, wherein said benzylic alcohol has structure (III), wherein said benzylic alcohol has structure (III), $Rb_2$ is a C-1 to C-4 alkyl. In yet another embodiment of the inventive composition, wherein said benzylic alcohol has structure (III), $Rb_1$ is H and $Rb_2$ is a C-1 to C-4 alkyl. In yet another embodiment of the inventive composition, said benzylic alcohol is benzyl alcohol.

In another embodiment of any of the inventive composition described herein, said benzylic alcohol component is present in the composition in an amount from about 30 wt % to about 90 wt % of said composition. In another aspect of this embodiment, the benzylic alcohol is present in the composition in an amount from about 40 wt % to about 90 wt %. In one, particular aspect, of this embodiment said benzylic alcohol is benzyl alcohol. In another aspect of this embodiment the benzylic alcohol is present in the composition in an amount from about 60 wt % to about 90 wt %. In another aspect of this embodiment the benzylic alcohol is present in an amount from about 70 wt % to about 90 wt %. In another aspect of this embodiment, the benzylic alcohol is present in the composition in an amount from about 40 wt % to about 85 wt %. In one, particular aspect, of this embodiment said benzylic alcohol is benzyl alcohol. In another aspect of this embodiment the benzylic alcohol is present in the composition in an amount from about 60 wt % to about 85 wt %. In another aspect of this embodiment the benzylic alcohol is present in the composition in an amount from about 70 wt % to about 85 wt %. In yet another aspect of this embodiment, the benzylic alcohol is present in the composition in an amount from about 40 wt % to about 80 wt %. In another aspect of this embodiment the benzylic alcohol is present in the composition in an amount from about 60 wt % to about 80 wt %. In another aspect of this embodiment the benzylic alcohol is present in the composition in an amount from about 70 wt % to about 80 wt %.

In one, particular aspect, of this embodiment said benzylic alcohol is benzyl alcohol.

In another embodiment of the inventive composition, said glycol component may be a mixture of at least two glycol compounds as described in herein.

In another embodiment of the inventive compositions, said glycol component may be a single glycol compound as described herein.

In one embodiment of the inventive compositions, said glycol component comprises at least one glycol compound having structure (IV), wherein Rg is a C-2 to C-4 alkylene moiety, wherein said alkylene moiety is either un-substituted or substituted with a C-1 to C-4 alkyl moiety.

(IV)

In another embodiment of the inventive compositions, said glycol component is a glycol compounds selected from the group consisting of compounds having structures (IVa), and (IVb), wherein n is an integer from 0 to 3, n" is an integer from 0 to 4, Rg1 is a C-1 to C-4 alkyl.

(IVa)

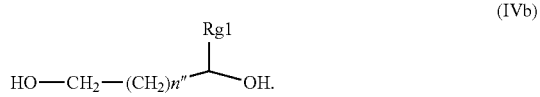

(IVb)

In another embodiment of the inventive compositions, said glycol component is a glycol compound of structure (IVa).

In yet another embodiment of the inventive compositions, said glycol component is the glycol compound of structure (IVb).

In still another embodiment of the inventive compositions, said glycol component is 1,3-propylene glycol.

In still another embodiment of the inventive compositions, said glycol component is is 1,2-ethylene glycol.

In yet another embodiment of the inventive compositions, said glycol component is 1,2-propylene glycol.

In another embodiment of the inventive composition, said glycol component is present in the composition in an amount from about 5 wt % to about 50 wt % of said composition. In another aspect of this embodiment said glycol component is present in the composition in an amount from about 8 wt % to about 40 wt % of said composition. In still another aspect of this embodiment said glycol component is present in the composition in an amount from about 8 wt % to about 30 wt %. In still another aspect said glycol component is present in the composition in an amount from about 8 wt % to about 20 wt %. In yet another aspect it is present in the composition in an amount from about 9 wt % to about 16 wt %.

In one aspect of the inventive composition said glycol component is a mixture of different glycol compounds which consists of a mixture of a glycol compound having structure (IV), (a.k.a. small molecule glycol) and an oligomeric glycol compound having structure (IVc), wherein and Rg and Rg2 are independently a C-2 to C-4 alkylene moiety. In this embodiment these alkylene moiety are either un-substituted or substituted with a C-1 to C-4 alkyl moiety, and further na is an integer ranging from 8 to 12, and nb is an integer ranging from 9 to 13.

(IV)

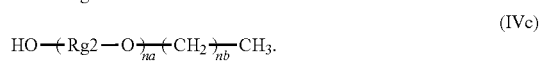

(IVc)

In one specific aspect of the inventive composition wherein said glycol component is the above described mixture which consists of a small molecule glycol compound and an oligomeric these materials have a more specific structure wherein the small molecule glycol compound it is one which has structure (IVa) and the oligomeric glycol compound is one which has structure (IVd), wherein n" is an integer from 0 to 4, Rg1 is a C-1 to C-4 alkyl, na' is an integer ranging from 8 to 12, and nb is an integer ranging from 9 to 13. In a more specific aspect of this embodiment, na' is an integer from 9 to 11, and nb is an integer ranging from 10 to 12.

In one specific aspect of the inventive composition wherein said glycol component is the above described mixture of a small molecule glycol compound and an oligomeric glycol compound, this is a mixture of 1,2-propylene glycol and decaethylene glycol monododecyl ether.

In any of the above aspects of the inventive composition wherein said glycol component consists of a mixture of a small molecule glycol compound and an oligomeric glycol compound, the small molecule glycol component may be present from about 9 wt % to about 15 wt % and the oligomeric glycol compound may be present from about 0.2 wt % to about 5 wt %. In another aspect of this embodiment the small molecule glycol component may be present from about 9 wt % to about 15 wt % and the oligomeric glycol component may be present from about 0.5 wt % to about 5 wt %. In still another aspect of this embodiment the small molecule glycol component may be present from about 9 wt % to about 15 wt % and the oligomeric glycol component may be present from about 1 wt % to about 5 wt %.

(IVa)

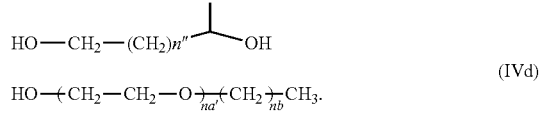

(IVd)

In one embodiment of the above described inventive composition said alkyl amine component is said dialkyl amine, or a mixture of said dialkyl amines. In one aspect of this embodiment said alkyl amine component is a mixture of said dialkyl amines. In another aspect of this embodiment said dialkyl amine component is a single said dialkyl amine.

In another embodiment of the above inventive composition, in which said amine component is said di-alkyl amine component it is one wherein said C-1 to C-4 n-alkyl group is methyl.

In another embodiment of the above inventive composition, in which said amine component is said di-alkyl amine component it is one wherein said C-16 to C-20 n-alkyl group is n-octadecyl.

In another embodiment of the above inventive composition, in which said amine component is said di-alkyl amine it has structure (V), wherein $R_1$ is a C-1 to C-4 alkyl. In another aspect of this embodiment $R_1$ is a C-1 to C-3 alky. In yet another aspect of this embodiment $R_1$ is a C-1 or C-2 alkyl.

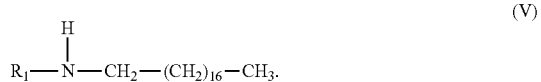

(V)

In another embodiment of the inventive composition, wherein said amine component is said dialkyl amine it is N-methyloctadecylamine.

In another embodiment of the inventive composition, wherein said alkyl amine component is said dialkyl amine it is present in the composition in an amount from about 0.2 wt % to about 10 wt % of said composition. In another aspect of this embodiment said dialkyl amine is present in the composition in an amount from about 0.5 wt % to about 5 wt % of said composition.

In another embodiment of the inventive composition, said alkyl amine component is said mono-alkyl-amine having structure (I) or a mixture of said mono-alkyl amines having structure (I). In another aspect of this embodiment only a single mono-alkyl amine having structure (I) is present. In another aspect of this embodiment a mixture of said mono-alkyl amines is present. In another aspect of these embodiments more specifically these can be chosen from compounds wherein in structure (I), m' and m are both selected from an integer from 4 to 8. Even more specifically in this embodiment m' and m may both be selected form an integer from 5 to 7. In another aspect of this embodiment m' and m are independently selected from an integer from 4 to 8. In another aspect of this embodiment m' and m are independently selected from an integer from 5 to 7.

In another embodiment of the inventive composition, wherein said alkyl amine component is said mono-alkyl-amine it has the more specific structure (Ia).

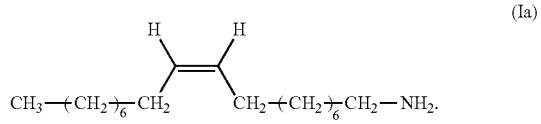

(Ia)

In any of the above described embodiment wherein the alkyl amine component is a mono-alkyl amine, it may range from about 0.05 wt % to about 1 wt % of said composition. In another aspect it may range from about 0.075 wt % to about 0.5 wt % of said composition. In yet another embodiment it may range from about 0.075 wt % to about 0.25 wt % of said composition.

Another aspect of this invention is a process comprising the steps:
i) heating any one the inventive compositions as described herein, at a temperature which is from about room temperature to about 200° C.;
ii) dipping a substrate coated with a patterned photoresist film into said heated composition for a time from about 1 minutes to about 60 minutes, until at least a portion of said patterned photoresist film is removed from said substrate, producing a dipped substrate with a removed patterned photoresist film;
iii) after dipping step ii), rinsing said dipped substrate with a removed patterned photoresist film with either isopropyl alcohol, water or a mixture of isopropyl alcohol and water to remove any residual composition from dipping step ii), producing a clean substrate;
iv) optionally, drying said clean substrate.

Another aspect of the above inventive process is one, wherein in step i), the composition is heated from about room temperature to about 100° C.

In yet another aspect of the above inventive process is one, wherein in step i), the composition is heated from about 60° C. to about 100° C.

Another aspect of any of the above inventive processes is one, wherein in step ii), the substrate is a metal.

In yet another aspect of any of the above inventive processes is one, wherein in step ii), the substrate is copper.

Another aspect of any of the above inventive processes is one, wherein in step ii), the substrate is dipped from about 20 minutes to about 90 minutes.

Another aspect of any of the above inventive processes is one, wherein in step ii), the substrate is dipped from about 20 minutes to about 60 minutes.

Another aspect of any of the above inventive processes is one, wherein in step ii), the substrate is dipped from about 30 minutes to about 60 minutes.

Another aspect of any of the above inventive processes is one, wherein in step iii) the rinse is done the rinse is done with a C-1 to C-3 alcohol or a mixture of C-1 to C-3 alcohol and water.

Another aspect of any of the above inventive processes is one, wherein in step iii) the rinse is done with a C-1 to C-3 alcohol.

Another aspect of any of the above inventive processes is one, wherein in step iii) the rinse is done with isopropyl alcohol or a mixture of isopropyl alcohol and water.

Another aspect of any of the above inventive processes is one, wherein in step iii) the rinse is done with isopropyl alcohol.

Another aspect of any of the above inventive processes is one, wherein optional step iv) is present and the drying is done by, for instance, either spin drying it in air, using a stream of nitrogen, argon or air to dry it, and the like.

The novel remover composition may be used in the above inventive process to remove patterns from many different types of suitable photoresist patterns, which are as follows:

The novel remover may be used to remove patterned resist films having a variety of thicknesses depending on the application, IC devices, IC devices interconnect, circuit board, solder board application, MEM, display and the like. Typically, the thickness tracts with the size of the device being manufactured starting from about tens of nanometers for state of the art IC, to the several microns range for larger IC devices, to 10 to 500 microns for very large devices such as MEM's.

Typically, these suitable resist pattern may arise from negative and positive photoresist material capable of forming patterns which may be selected from ones which may form patterns using different types of radiation. For instance, as non-limiting examples suitable resist patterns for removal may be formed from i-line photoresists, g-line photoresists 248 nm photoresists, 193 nm photoresist, Extreme Ultraviolet photoresists, electron beam photoresists and particle beam photoresists. These suitable photoresist patterns may arise from photoresists which may be further classified as follows by the type of chemistry which is employed to obtain the pattern.

For instance, suitable positive pattern may result from, exposure by visible, i-line, K-line, and g-line and development by aqueous base employ of photoresists based upon a Novolak resin and a diazonaphthoquinone (DNQ) type sensitizer material, these types of resist system may also yield negative images through a tone reversal process. The following reference gives an account of Diazonapthoquinone Novolak based resists: (Diazonapththoquinone-based Resists, Chapter 2, Basic Chemistry of DNQ/Novolak resists, SPIE Optional Engineering Press volume TT 11, page 9, 1993).

Other suitable resist patterns for use with the novel high $pK_a$ remover composition and remover process, may be ones resulting from both negative which are chemically amplified and aqueous base developable. Typically, resist patterns are formed by 248 nm, 193 nm, EUV to enable higher resolutions patterns, but resist patterns may also be produced using longer wavelengths, such as visible, broadband UV, i-line, g-line, and h-line. Typically, such suitable positive resist patterns for use with the novel remover compositions, and processes, are ones which results from positive tone chemically amplified resists, resins which are latently aqueous base soluble, such as (meth)acrylate copolymers, styrenic copolymer, Novolaks, phenolic resins, are rendered aqueous base soluble by deprotecting acid cleavable group which mask aqueous base solubilizing moieties. The base solubilizing moieties may be carboxylic acids, phenols, or other moieties having typically a $pK_a$ below 11 such that aqueous base will largely ionize them. The acid is generated in exposed areas of the photoresist film by a photoacid generating compound. This acid deprotects the acid cleavable group through a process of acidolysis, or hydrolysis, releasing a free, base solubilizing moiety, allowing, in exposed areas for the photoresist film to be aqueous base soluble.

Suitable resist patterns which results from negative tone, aqueous developable crosslinking photoresists, are base soluble resins, whose inherent aqueous base solubility is not masked by any protecting group. Rather, in this approach, an inherently base soluble resin (binder resin) such as ones based on aqueous base soluble (meth)acrylate copolymers, styrenic copolymer, Novolaks, and the like are crosslinked through meth(acrylate) moieties pendant to the base soluble resin, or crosslinking additives (crosslinking agents), or through a mixture of both types of crosslinking moieties. Typically, photo-radical generators generate reactive radicals in exposed resist areas of such resists, crosslinking and rendering insoluble these exposed areas. Aqueous base development results in removal of non-crosslinked areas forming a negative resist pattern.

When a crosslinking additive is present it comprises at least two olefinic moiety, which is easily susceptible to radical crosslinking. Examples of such crosslinking moieties which may be present at pendant groups on the resin or in crosslinking additives, are vinyl aryl moieties such as styrenes, and acrylate or methacrylate moieties (a.k.a. meth (acrylate)). Non-limiting, more specific examples of these radical crosslinking additive can be appropriately selected, depending on the purposes, from acrylic acid derivatives such as acrylic acid esters and methacrylic acid derivatives such as methacrylic acid esters. Crosslinking additives may have a low molecular weight (monomer property) or a high molecular weight (oligomer or polymer property). In this instance, the additive may be small molecule, an oligomer or a polymer which contain multiple radical crosslinkable moieties. Some of these radical crosslinking additives may have structures within them which are acid cleavable. Such structures may be of use during further processing of the patterned film, for instance in facilitating stripping of the resist after pattern transfer into the substrate. Examples of such acid cleavable groups are tertiary ethers, tertiary carboxylates, and the like which are susceptible to acidolytic cleavage without advantageous water, or alternatively acid cleavable moieties which may readily undergo complete hydrolytic cleavage with photo-acid advantageous water in the resist film such as acetal, ketals, and alkyl silyl ethers. A non-limiting example of such materials is described in U.S. Pat. No. 7,601,482.

EXAMPLES

Reference will now be made to more specific embodiments of the present disclosure and experimental results that provide support for such embodiments. However, Applicants note that the disclosure below is for illustrative purposes only and is not intended to limit the scope of the claimed subject matter in any way.

Chemicals

Tetramethylammonium hydroxide (TMAH, 25 wt % in water, CAS: 75-59-2), benzyl alcohol (CAS: 100-51-6), propylene glycol (CAS: 57-55-6), ethylene glycol (CAS: 107-21-1), diethanolamine (CAS: 111-42-2), N-methyloctadecylamine (CAS: 2439-55-6), Decaethylene glycol monododecyl ether (CAS 9002-92-0) and Oleylamine (CAS 112-90-3) were obtained from Sigma Aldrich (3050 Spruce St., St. Louis, Mo. 63103). The 20 wt % solution of TMAH in propylene glycol was obtained from SACHEM Americas (21 E. Woodward St., Austin, Tex. 78704.)

Processing

Silicon 200 mm (8") wafers with 150 nm copper sputter coating were used for metal corrosion testing. A copper coated silicon wafer coupon (either fresh coupon or a coupon with removed photoresist) was immersed in a preheated photoresist remover solution for a time of periods that were more than enough to strip a photoresist. Regular inspection was done to check the condition of the metal surface by visual and microscopic inspection for the presence of surface haze as indicative of corrosion. Surface haze can be identified and confirmed at levels more sensitive than gravimetric analysis (<10 Å/min).

For photoresist stripping tests, silicon 200 mm (8") wafers with 150 nm copper sputter coating were used as the substrate upon which a negative-tone photoresist AZ®-200 nXT (a product of EMD Performance Materials, Branchburg, N.J. 08876) was applied and processed. The processing consisted of spin coating the resist to a 50 μm thickness and applying a soft bake on a hotplate at 110° C. for 180 sec. The resist was then exposed to 1600 mJ/cm2 of light through a contact hole patterned mask. Development used AZ® 300 MIF Developer (a product of EMD Performance Materials, Branchburg, N.J. 08876) in two puddles of 60 seconds each followed by a rinse with DI water.

Photoresist Stripping and Copper Corrosion Test 1

A photoresist remover solution was prepared by dissolving 4.14 g of 25 wt % aqueous TMAH solution, 27.08 g of benzyl alcohol, 3.14 g of propylene glycol and 1.34 g N-methyloctadecylamine. The solution was heated on a hotplate to 80° C. in a 150-mL beaker with a magnetic stirring bar (200 rpm). Copper wafer coupon with photoimaged AZ®-200 nXT patterns was immersed in the heated solution. After 30 min, the crosslinked photoresist patterns were completely removed. The same copper coupon after the photoresist was removed was immersed in the solution for another 30 min Copper surface was free of haze and essentially intact by visual and microscopic inspections.

Photoresist Stripping and Copper Corrosion Test 2

A photoresist remover solution was prepared by dissolving 7.41 g of 25 wt % aqueous TMAH solution, 35.01 g of benzyl alcohol, 3.89 g of propylene glycol and 0.235 g N-methyloctadecylamine. The solution was heated on a hotplate to 80° C. in a 150-mL beaker with a magnetic stirring bar (200 rpm). Copper wafer coupon with photoimaged AZ®-200 nXT patterns was immersed in the heated solution. After 30 min, the crosslinked photoresist patterns were completely removed. The same copper coupon after the photoresist was removed was immersed in the solution for another 30 min Copper surface was free of haze and essentially intact by visual and microscopic inspections.

Photoresist Stripping and Copper Corrosion Test 3

A photoresist remover solution was prepared by dissolving 7.41 g of 25 wt % aqueous TMAH solution, 35.01 g of benzyl alcohol, 3.89 g of propylene glycol and 0.416 g N-methyloctadecylamine. The solution was heated on a hotplate to 80° C. in a 150-mL beaker with a magnetic stirring bar (200 rpm). Copper wafer coupon with photoimaged AZ®-200 nXT patterns was immersed in the heated solution. After 30 min, the crosslinked photoresist patterns were completely removed. The same copper coupon after the photoresist was removed was immersed in the solution for another 30 min Copper surface was free of haze and essentially intact by visual and microscopic inspections.

Photoresist Stripping and Copper Corrosion Test 4

A photoresist remover solution was prepared by dissolving 7.15 g of 25 wt % aqueous TMAH solution, 25 g of benzyl alcohol, 7.26 g of ethylene glycol and 0.4 g N-methyloctadecylamine. The solution was heated on a hotplate to 80° C. in a 150-mL beaker with a magnetic stirring bar (200 rpm). Copper wafer coupon with photoimaged AZ®-200 nXT patterns was immersed in the heated solution. After 30 min, the crosslinked photoresist patterns were completely removed. The same copper coupon after the photoresist was removed was immersed in the solution for another 30 min Copper surface was free of haze and essentially intact by visual and microscopic inspections.

Photoresist Stripping and Copper Corrosion Test 5

A photoresist remover solution was prepared by dissolving 14 g of 20 wt % TMAH solution in propylene glycol, 55.3 g of benzyl alcohol, 0.7 g of N-methyloctadecylamine. The solution was heated on a hotplate to 80° C. in a 150-mL beaker with a magnetic stirring bar (200 rpm). Copper wafer coupon with photoimaged AZ®-200 nXT patterns was immersed in the heated solution. After 30 min, the crosslinked photoresist patterns were completely removed. The same copper coupon after the photoresist was removed was immersed in the solution for another 30 min Copper surface was free of haze and essentially intact by visual and microscopic inspections.

Photoresist Stripping and Copper Corrosion Test 6

A photoresist remover solution was prepared by dissolving 12.03 g of 20 wt % TMAH solution in propylene glycol, 59.3 g of benzyl alcohol, 1.46 g of decaethylene glycol mono-dodecyl ether and 0.11 g of oleylamine. The solution was heated on a hotplate to 80° C. in a 150-mL beaker with a magnetic stirring bar (200 rpm). Copper wafer coupon with photoimaged AZ®-200 nXT patterns was immersed in the heated solution. After 30 min, the crosslinked photoresist patterns were completely removed. The same copper coupon after the photoresist was removed was immersed in the solution for another 30 min. Copper surface was free of haze and essentially intact by visual and microscopic inspections.

The following examples show that TMAH-based formulations without N-methyloctadecylamine, or oleylamine, surprisingly, failed to remove negative-tone photoresist coating completely leaving behind an undesirable residue on copper substrates. These are two alkyl amines (a.k.a. claimed said di-alkyl-amine and said mono-alkyl-amine), which fall within the scope of the inventive stripper composition.

Comparative Photoresist Stripping Test 1

A photoresist remover solution was prepared by dissolving 53.2 g of 25 wt % aqueous TMAH solution, 251.4 g of benzyl alcohol, 27.9 g of propylene glycol. The solution was heated on a hotplate to 80° C. in a beaker with a magnetic stirring bar (200 rpm). Copper wafer coupon with photoimaged AZ®-200 nXT patterns was immersed in the heated solution. After 60 min, the majority of the crosslinked photoresist patterns was removed, but an undesirable thin layer of residual photoresist remained on the copper surface.

Comparative Photoresist Stripping Test 2

A photoresist remover solution was prepared by dissolving 12.83 g of 25 wt % aqueous TMAH solution, 64.53 g of benzyl alcohol, 3.25 g of diethanolamine. The solution was heated on a hotplate to 80° C. in a 150-mL beaker with a magnetic stirring bar (200 rpm). Copper wafer coupon with photoimaged AZ®-200 nXT patterns was immersed in the heated solution. After 30 min, the majority of the crosslinked photoresist patterns was removed, but an undesirable thin layer of residual photoresist remained on the copper surface.

We claim:

1. A composition comprising:
   - A) tetraalkylammonium hydroxide;
   - B) a benzylic alcohol,
   - C) a glycol component comprising at least one glycol compound, and
   - D) an alkyl amine component, wherein said alkyl amine component is selected from the group consisting of:
     - a) a di-alkyl amine, in which one of the alkyl groups is a C-1 to C-4 n-alkyl and the other is a C-16 to C-20 n-alkyl;
     - b) a mono-alkyl amine having structure (I)

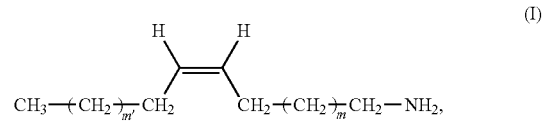

wherein m' and m are independently chosen from an integer ranging from 4 to 8; and
     - c) combinations thereof.

2. The composition of claim 1, wherein said tetraalkylammonium hydroxide has structure (II), wherein $Ra_1$, $Ra_2$, $Ra_3$, and $Ra_4$ are independently selected from a C-1 to C-16 alkyl, or a benzylic moiety

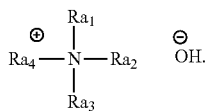
(II)

3. The composition of claim 2, wherein $Ra_1$, $Ra_2$, $Ra_3$, and $Ra_4$ are independently selected from a C-1 to C-4 linear alkyl, or a benzylic moiety.

4. The composition of claim 1, wherein said tetraalkylammonium hydroxide is selected from the group consisting of tetramethylammonium hydroxide, tetraethylammonium hydroxide, tetrapropylammonium hydroxide, tetrabutylammonium hydroxide, and benzyltrimethylammonium hydroxide.

5. The composition of claim 1, wherein said tetraalkylammonium hydroxide is present in the composition in an amount from about 0.5 wt % to about 10 wt % of said composition.

6. The composition of claim 1, wherein the composition further comprises water in an amount from about 1 wt % to about 20 wt % of said composition.

7. The composition of claim 1, wherein the composition is substantially water-free.

8. The composition of claim 1, wherein said benzylic alcohol has structure (III), wherein Rb1 is selected from the group consisting of H, a C-1 to C-4 alkyl, and a C-1 to C-4 alkoxy, and $Rb_2$ is selected from the group of H and a C-1 to C-4 alkyl

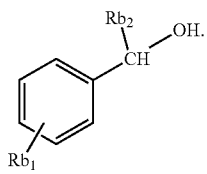
(III)

9. The composition of claim 1, wherein the benzylic alcohol is present in the composition in an amount from about 30 wt % to about 90 wt % of said composition.

10. The composition of claim 1, wherein said glycol component comprises a single glycol compound.

11. The composition of claim 1, wherein said glycol component comprises a mixture of glycol compounds.

12. The composition of claim 1, wherein said glycol component comprises at least one glycol compound having structure (IV), wherein Rg is a C-2 to C-4 alkylene moiety, wherein said alkylene moiety is either un-substituted or substituted with a C-1 to C-4 alkyl moiety

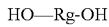
(IV).

13. The composition of claim 1, wherein said glycol component is a glycol compound selected from the group consisting of compounds having structure (IVa), and compounds having structure (IVb), wherein n is an integer from 0 to 3, n" is an integer from 0 to 4, and Rg1 is a C-1 to C-4 alkyl;

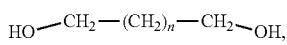
(IVa)

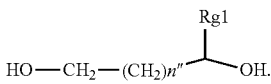
(IVb)

14. The composition of claim 1, wherein said glycol component is present in the composition in an amount from about 5 wt % to about 50 wt % of said composition.

15. The composition of claim 1, wherein said mixture of glycol compounds consists of
a glycol compound having structure (IVb), wherein n" is an integer from 0 to 4, and Rg1 is a C-1 to C-4 alkyl; and
an oligomeric glycol compound having structure (IVd), wherein na' is an integer from 8 to 12, and nb is an integer ranging from 9 to 13,

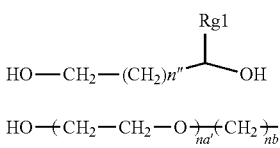
(IVb)

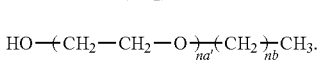
(IVd)

16. The composition of claim 15, wherein Rg1 is methyl; na' is an integer from 9 to 11, and nb is an integer ranging from 10 to 12.

17. The composition of claim 1, wherein the glycol compound having structure (IV) is present in the composition in an amount from about 9 wt % to about 15 wt % and the oligomeric glycol compound having structure (IVc) is present in the composition in an amount from about 0.5 wt % to about 5 wt %.

18. The composition of claim 1, wherein said alkyl amine component is said dialkyl amine, or a mixture of said dialkyl amines.

19. The composition of claim 1, wherein said alkyl amine component is said di-alkyl amine in which one of the alkyl groups is methyl.

20. The composition of claim 1, wherein said alkyl amine component is a di-alkyl amine having structure (V), wherein $R_1$ is a C-1 to C-4 alkyl;

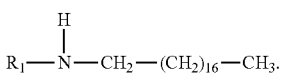
(V)

21. The composition of claim 1, wherein said di-alkyl amine is present in the composition in an amount from about 0.2 wt % to about 10 wt % of said composition.

22. The composition of claim 1, wherein said alkyl amine component is said mono-alkyl-amine.

23. The composition of claim 1, wherein said alkyl amine component is a mono-alkyl amine, wherein m' and m are both selected from an integer from 4 to 8.

24. The composition of claim 1, wherein said alkyl amine component is a mono-alkyl amine, wherein m' and m are independently selected from an integer from 5 to 7.

25. The composition of claim 1, wherein a mono-alkyl amine is present in the composition in an amount from about 0.05 wt % to about 1 wt % of said composition.

26. A process comprising the steps;
i) heating the composition of claim 1, at a temperature which is from about room temperature to about 200° C.;
ii) dipping a substrate coated with a patterned photoresist film into said heated composition for a time from about 1 minute to about 60 minutes, until at least a portion of said patterned photoresist film is removed from said substrate, producing a dipped substrate with a removed patterned photoresist film;
iii) after dipping step ii), rinsing said dipped substrate with a removed patterned photoresist film with either isopropyl alcohol, water or a mixture of isopropyl alcohol and water to remove any residual composition from dipping step ii), producing a clean substrate;
iv) optionally, drying said clean substrate.

* * * * *